US008887031B2

United States Patent
Horita (10) Patent No.: US 8,887,031 B2
(45) Date of Patent: Nov. 11, 2014

(54) ERROR CORRECTING METHOD, ERROR CORRECTING APPARATUS, SENDING DEVICE, RECEIVING DEVICE, AND ERROR CORRECTING PROGRAM

(71) Applicant: NEC Corporation, Tokyo (JP)

(72) Inventor: Satomi Horita, Tokyo (JP)

(73) Assignee: NEC Corporation, Tokyo (JP)

( * ) Notice: Subject to any disclaimer, the term of this patent is extended or adjusted under 35 U.S.C. 154(b) by 104 days.

(21) Appl. No.: 13/624,542

(22) Filed: Sep. 21, 2012

(65) Prior Publication Data

US 2013/0080852 A1 Mar. 28, 2013

(30) Foreign Application Priority Data

Sep. 23, 2011 (JP) ................................. 2011-208261

(51) Int. Cl.
  *H03M 13/00* (2006.01)
  *H03M 13/29* (2006.01)
(52) U.S. Cl.
  CPC ................................ *H03M 13/2921* (2013.01)
  USPC ........................................................ 714/776
(58) Field of Classification Search
  CPC ..................... H03M 13/2906; H03M 13/2909; H03M 13/2918; H03M 13/2921
  USPC ........................................ 714/776, 777, 800
  See application file for complete search history.

(56) References Cited

U.S. PATENT DOCUMENTS

2002/0083391 A1* 6/2002 Huggett et al. ............... 714/777
2012/0096328 A1* 4/2012 Franceschini et al. ........ 714/758

FOREIGN PATENT DOCUMENTS

JP 2010-166378 A 7/2010

OTHER PUBLICATIONS

International Telecommunication Union, Series G: Transmission Systems and Media, Digital Systems and Networks, ITU-T Recommendation G.975.1, Feb. 2004, 58 pages.
International Telecommunication Union, Series G: Transmission Systems and Media, Digital Systems and Networks, ITU-T G.709/Y.1331, Dec. 2009, 218 pages.

* cited by examiner

*Primary Examiner* — Sam Rizk
(74) *Attorney, Agent, or Firm* — Sughrue Mion, PLLC (57) ABSTRACT

An error correcting method for correcting an error of digital data is provided. The method includes a plurality of sub-frames including a plurality of block code words, including: extracting and aligning a block code word, which is included in a past sub-frame; and generating a redundant data block code word by use of a block code word, which is included in a latest sub-frame, and the aligned block code word, and adding the redundant data block code word to the latest sub-frame, wherein the redundant data block code word is used for generating a redundant data block code word, which is added to a next sub-frame.

11 Claims, 8 Drawing Sheets

ERROR CORRECTING METHOD, ERROR CORRECTING APPARATUS, SENDING DEVICE, RECEIVING DEVICE, AND ERROR CORRECTING PROGRAM

This application is based upon and claims the benefit of priority from Japanese Patent Application No. 2011-208261, filed on Sep. 23, 2011, the disclosure of which is incorporated herein in its entirety by reference.

TECHNICAL FIELD

The present invention relates to an error correcting method, an error correcting apparatus, a sending device, a receiving device and an error correcting program and in particular, relates to an error correcting method, an error correcting apparatus, a sending device, a receiving device and an error correcting program which are applied to the high-speed digital transmission.

BACKGROUND ART

With regard to the recent digital transmission, for example, the error correcting method, which uses the concatenated code described in ITU-T Recommendation G.975.1 (ITU-T recommendation G series) I.3, is proposed.

For example, ITU-T Recommendation G.709 (ITU-T recommendation G series) describes the OTU (Optical channel Transport Unit) frame as a transmission frame which is used in a high-speed and large-volume optical communication system installing an error correction function. The OTU frame includes an area for a payload which stores communication data, an area for a frame synchronization, an area for maintenance and monitoring information, an area for mapping the payload, and an area which stores information on an error correcting code for correcting a bit error.

Figure 7:
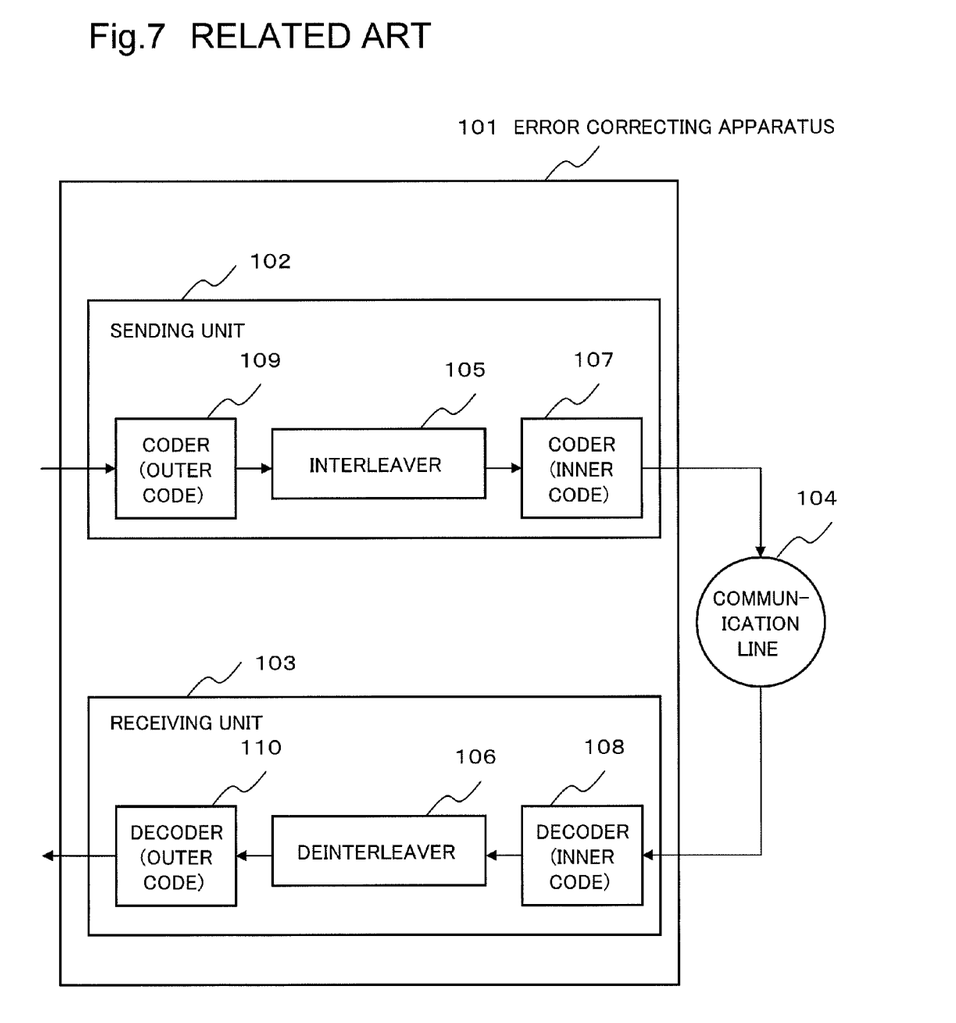
FIG. 7 shows an example of a configuration of an error correcting apparatus according to the related art.

FIG. 7 shows a configuration of an error correcting apparatus according to a related art. An error correcting apparatus 101 includes a sending unit 102 and a receiving unit 103. A transmission signal, which is sent into a communication line 4 by the sending unit, is received by the receiving unit 103.

According to the forward error correction (FEC) scheme described in ITU-T Recommendation G.975.1, a code, in which an outer code and an inner code are concatenated to each other, is used, and an interleaver 105 and a deinterleaver 106 are arranged between a coder (outer code) 109 and a coder (inner code) 107, and between a decoder (outer code) 110 and a decoder (inner code) 108 respectively, as shown in FIG. 7. The concatenated code is applied to the repeated decoding.

Figure 8:
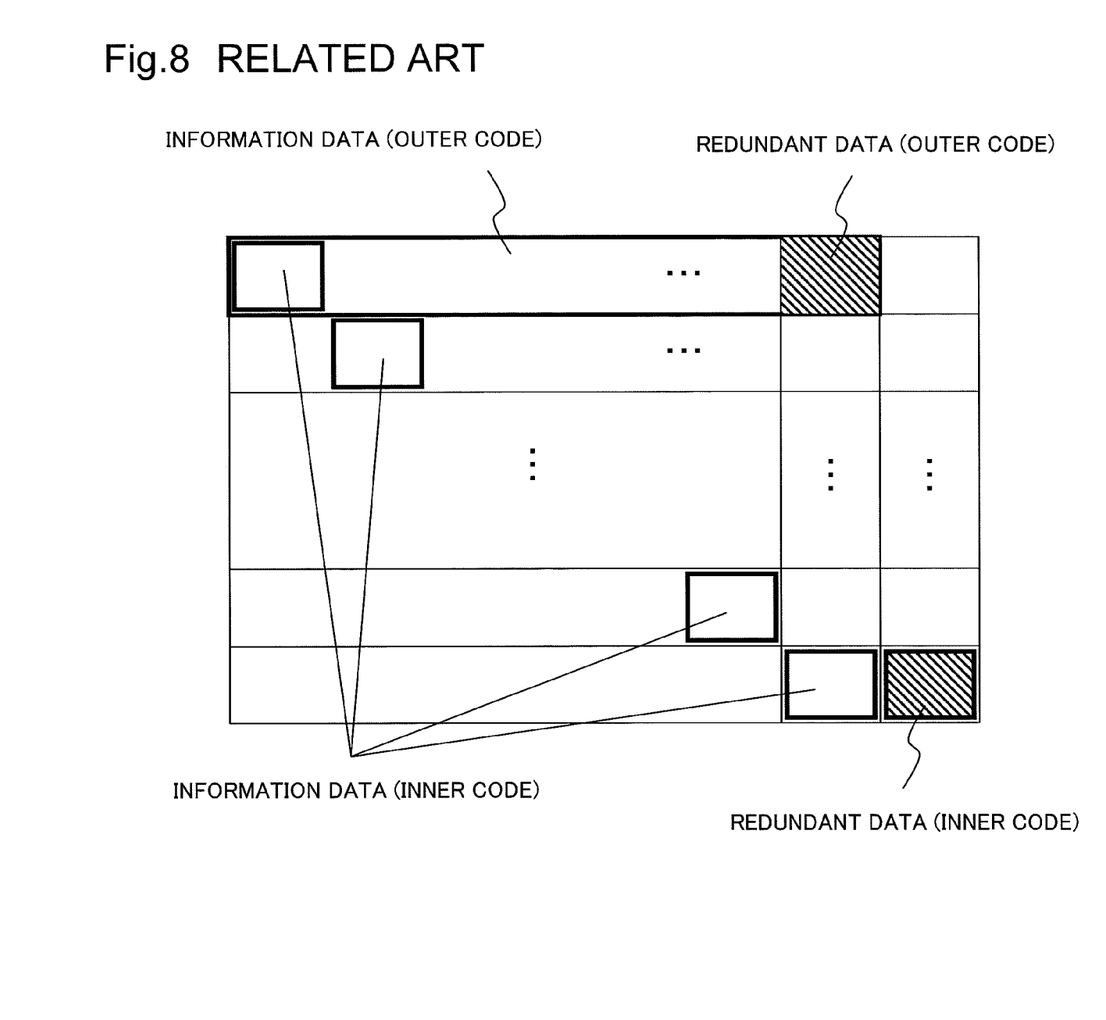
FIG. 8 shows an example of a structure of data which is processed with an error correcting method according to the related art.

FIG. 8 shows a configuration of digital data which is processed with an error correcting method according to the related art. Data per one row in FIG. 8 is sent and received at a predetermined timing. An error correcting process for the outer code is carried out to a data stream which is sent and received at each timing. In contrast, an error correcting process for the inner code is carried out to data, which is extracted through the interleaver from a predetermined position in a past data stream.

Though an arbitrary code may be employed for the inner/outer code, an example with the block code will be described in the present application A node apparatus disclosed in Japanese Patent Application Laid-Open No. 2010-166378 transmits a transmission frame which is generated through adding an overhead and an error correcting code to information data. Moreover, a repeated decoding process for decoding the error correcting code is carried out for the received transmission frame. When all error bits of the transmission frame are corrected before a predetermined number of times of the repeated decoding processes are completed, the error correcting process afterward is stopped. As a result, unnecessary power consumption is suppressed.

The error correcting method, which is based on the concatenated code by use of the inner code and the outer code and which is described in ITU-T Recommendation G.975.1 and Japanese Patent Application Laid-Open No. 2010-166378, has the following problem.

Firstly, the concatenation of the error correcting codes lowers the error correcting ability. While information data of the inner code composes not only data of the inner code but also data of the outer code, redundant data of the inner code does not compose the outer code. For this reason, the error correction is carried out only to the inner code. According to FIG. 8, since redundant data of the outer code is included in the information data of the inner code, in the case that a transmission failure causes an error in the redundant data of the outer code, the error is corrected in the error correcting process for the inner code. Even when the inner code could not carry out the error correction, the error can be corrected by the outer code error correcting process. On the other hand, only the inner code error correcting process is carried out for the redundant data of the inner code, and the outer code error correcting process is not carried out. For this reason, in the case that the redundant code of the inner code is caused an error, there is a fear that the error correcting process for the inner code is not carried out correctly.

Secondly, the error correcting method using the concatenated code increases a circuit scale. That is, since a code length of the outer code and a code length of the inner code are different from each other, the coder and the decoder, which are used in the error correcting process for the inner code, are different respectively from the coder and the decoder used in the error correcting process for the outer code. Consequently, two circuits are needed in each of the error correcting process for the inner code, and the error correcting process for the outer code.

Meanwhile, as digital transmission data is being enlarged in volume, and speed of the digital transmission data is increasing, it is required to improve the error correcting ability in the error correcting process the transmission data. Moreover, it is required to make a processing circuit, which carries out the data error correction, smaller in a circuit scale in response to a request for miniaturizing a transmission apparatus and lowering the cost of the transmission apparatus.

SUMMARY

An object of the present invention is to provide an error correcting method, an error correcting apparatus, a sending device, a receiving device, and an error correcting program which can solve the problem mentioned above.

An error correcting method for correcting an error of digital data, which includes a plurality of sub-frames including a plurality of block code words, according to an exemplary aspect of the invention, includes: extracting and aligning a block code word, which is included in a past sub-frame; and generating a redundant data block code word by use of a block code word, which is included in a latest sub-frame, and the aligned block code word, and adding the redundant data block code word to the latest sub-frame, wherein the redundant data block code word is used for generating a redundant data block code word, which is added to a next sub-frame.

An error correcting apparatus to send digital data, which includes a plurality of sub-frames including a plurality of block code words, into a communication line, and to receive a received signal from the communication line, according to an exemplary aspect of the invention, includes: a sending unit, including: an interleaver, which extracts and aligns a block code word included in a past sub-frame; and a coder, which generates a redundant data block code word by use of a block code word included in a latest sub-frame and the aligned block code word, and generates a transmission signal through adding the redundant data block code word to the latest sub-frame; and a receiving unit, including: a deinterleaver, which extracts and aligns a block code word included in a past sub-frame included in the received signal; and a decoder, which carries out an error correcting process through extracting a code word and a redundant data block code word included in a latest sub-frame included in the received signal, wherein the redundant data block code word is used for generating a redundant data block code word, which is added to a next sub-frame.

A non-transitory computer readable medium storing a program, causing a computer to execute an error correcting process for correcting an error of digital data, which includes a plurality of sub-frames including a plurality of block code words, according to an exemplary aspect of the invention, the error correcting process includes: extracting and aligning a block code word, which is included in a past sub-frame; and generating a redundant data block code word by use of a block code word, which is included in a latest sub-frame, and the aligned block code word, and adding the redundant data block code word to the latest sub-frame, wherein the redundant data block code word is used for generating a redundant data block code word, which is added to a next sub-frame.

A sending device to send digital data, which includes a plurality of sub-frames including a plurality of block code words, into a communication line, according to an exemplary aspect of the invention, includes: an interleaver, which extracts and aligns a block code word included in a past sub-frame; and a coder to generate a redundant data block code word by use of a block code word, which is included in a latest sub-frame, and the aligned block code word, and to add the redundant data block code word to the latest sub-frame, wherein the redundant data block code word is used for generating a redundant data block code word, which is added to a next sub-frame.

A receiving device to receive digital data, which includes a plurality of sub-frames including a plurality of block code words, and to correct an error of the received digital data, according to an exemplary aspect of the invention, includes: a deinterleaver, which extracts and aligns a block code word included in a past sub-frame included in the digital data; and a decoder to carry out an error correcting process through extracting a code word and a redundant data block code word, which are included in a latest sub-frame included in the received signal, wherein the redundant data block code word is used in an error correcting process for correcting an error of a sub-frame different from the latest sub-frame.

An error correcting apparatus to send digital data, which includes a plurality of sub-frames including a plurality of block code words, into a communication line, and to receive a received signal from the communication line, according to an exemplary aspect of the invention, includes: a sending means, including: an interleaving means for extracting and aligning a block code word included in a past sub-frame; and a coding means for generating a redundant data block code word by use of a block code word included in a latest sub-frame and the aligned block code word, and for generating a transmission signal through adding the redundant data block code word to the latest sub-frame; and a receiving means, including: a deinterleaving means for extracting and aligning a block code word included in a past sub-frame included in the received signal; and a decoding means for carrying out an error correcting process through extracting a code word and a redundant data block code word included in a latest sub-frame included in the received signal, wherein the redundant data block code word is used for generating a redundant data block code word, which is added to a next sub-frame.

BRIEF DESCRIPTION OF THE DRAWINGS

Exemplary features and advantages of the present invention will become apparent from the following detailed description when taken with the accompanying drawings in which.

EXEMPLARY EMBODIMENT

An exemplary embodiment according to the present invention will be described with reference to a drawing. However, the present invention is not limited to the exemplary embodiment shown in the following.

[First Exemplary Embodiment]

Figure 1:
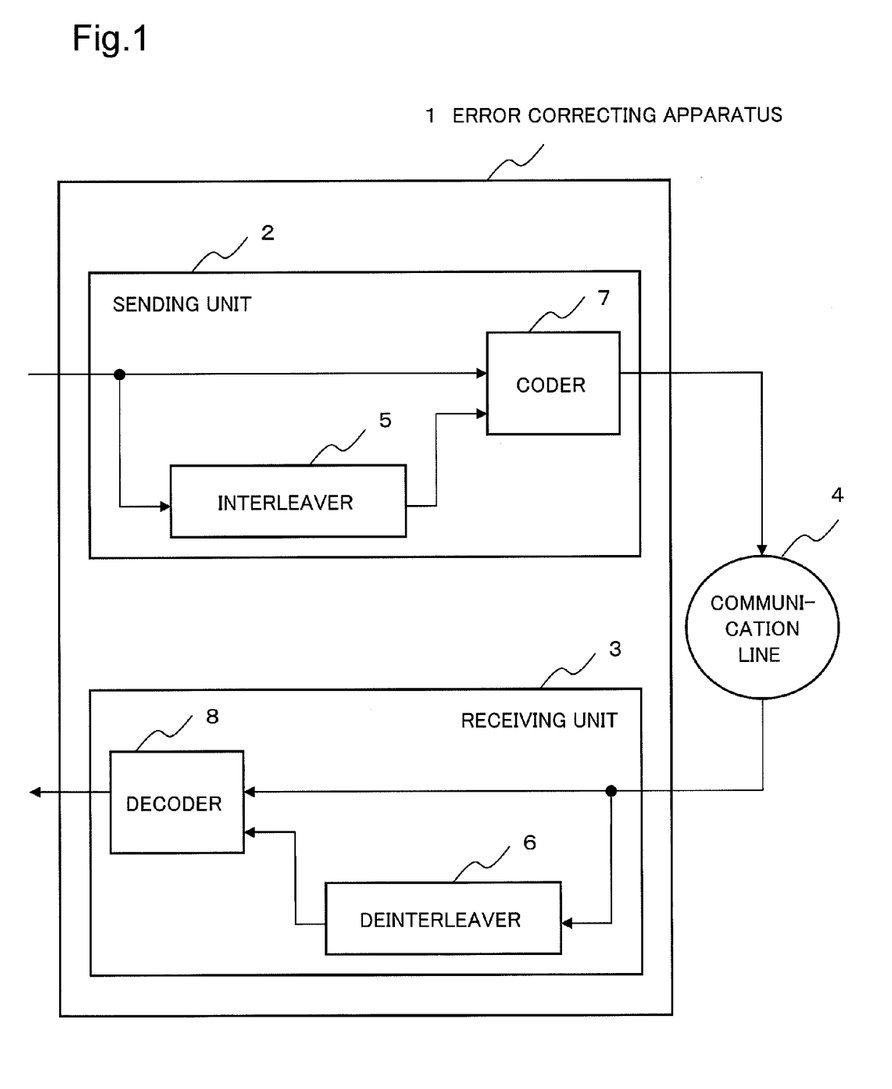
FIG. 1 shows an example of a configuration of an error correcting apparatus according to a first exemplary embodiment of the present invention.

FIG. 1 shows an example of a configuration of an error correcting apparatus according to a first exemplary embodiment of the present invention. The configuration may be a block diagram of a circuit, or may be a diagram in which components are connected.

According to FIG. 1, an error correcting apparatus 1 includes a sending unit 2 to generate a transmission signal through carrying out a coding process for error correction to an input signal which is digital data, and to send the transmission signal into a communication line, and a receiving unit 3 to receive a received signal from a communication line 4 and carries out an error correcting process to the received signal, and outputs the corrected receiving data as an output signal.

The sending unit 2 includes an interleaver 5 to hold the input signal, and to extract data, which exists at a predetermined position, from a past input signal, and to align the extracted data in the time domain, and to output the aligned data, and a coder 7 to generate redundant data on the basis of the past data which the interleaver 5 outputs, and the input signal, to add the redundant data to the input signal, and to output a result of the addition. The outputted transmission signal is sent into the communication line 4.

The receiving unit 3 includes a decoder 8 and a deinterleaver 6. The receiving unit 3 receives the received signal, which is transmitted through the communication line 4, and transfers the received signal to the decoder 8 and the deinterleaver 6. The deinterleaver 6 holds and aligns the received signal and extracts data which exists at a predetermined position, and outputs the extracted data in a predetermined order. The decoder 8 corrects an error of a code word on the basis of the signal which is outputted by the deinterleaver 6, and the received signal according to a predetermined procedure.

Next, the data structure of the transmission signal or the received signal, which is processed with an error correcting method according to the present exemplary embodiment, will be described with reference to FIG. 2.

The data structure for the error correcting process is almost the same as one shown in FIG. 8. However, the error correcting method of the present exemplary embodiment does not distinguish a code, such as the inner code or the outer code.

Data, which is sent and received at a predetermined timing, corresponds to data per one row in FIG. 2 (hereinafter, called sub-frame). According to the error correcting method of the present exemplary embodiment, data which exists at a predetermined position in a past data stream (a part of code word) is extracted. Furthermore, another part of the code word included in a latest data stream is extracted. The error correcting process is carried out on the basis of the code word which includes data extracted from the past sub-frame and data extracted from the latest data stream. That is, when generating the transmission signal, extracted data are summarized to be information data, redundant data is generated on the basis of the information data, and when processing the received signal, the error correcting process is carried out on the basis of the code word (information data+the redundant data) which are extracted. As a result, an output signal, which corresponds to a result of the error correcting process, is obtained.

According to the error correcting method of the present exemplary embodiment, (n)-th redundant data is generated on the basis of information data which includes a part of a data stream sent or received at (n−m)-th to (n−1)-th past timing, and a data stream sent or received at (n)-th timing. Moreover, (n+1)-th redundant data is generated on the basis of information data which includes a part of a data stream sent or received at (n−m+1)-th to (n)-th past timing, and a data stream sent or received at (n+1)-th timing. At this time, the (n)-th redundant data is processed as data which is included in the (n+1)-th information data. According to the error correcting method of the present exemplary embodiment, each data including the redundant data is always used as an element of two code word streams. That is, the redundant data, which is generated with the error correcting method, is held to be used for generating a next redundant data.

Figure 2:
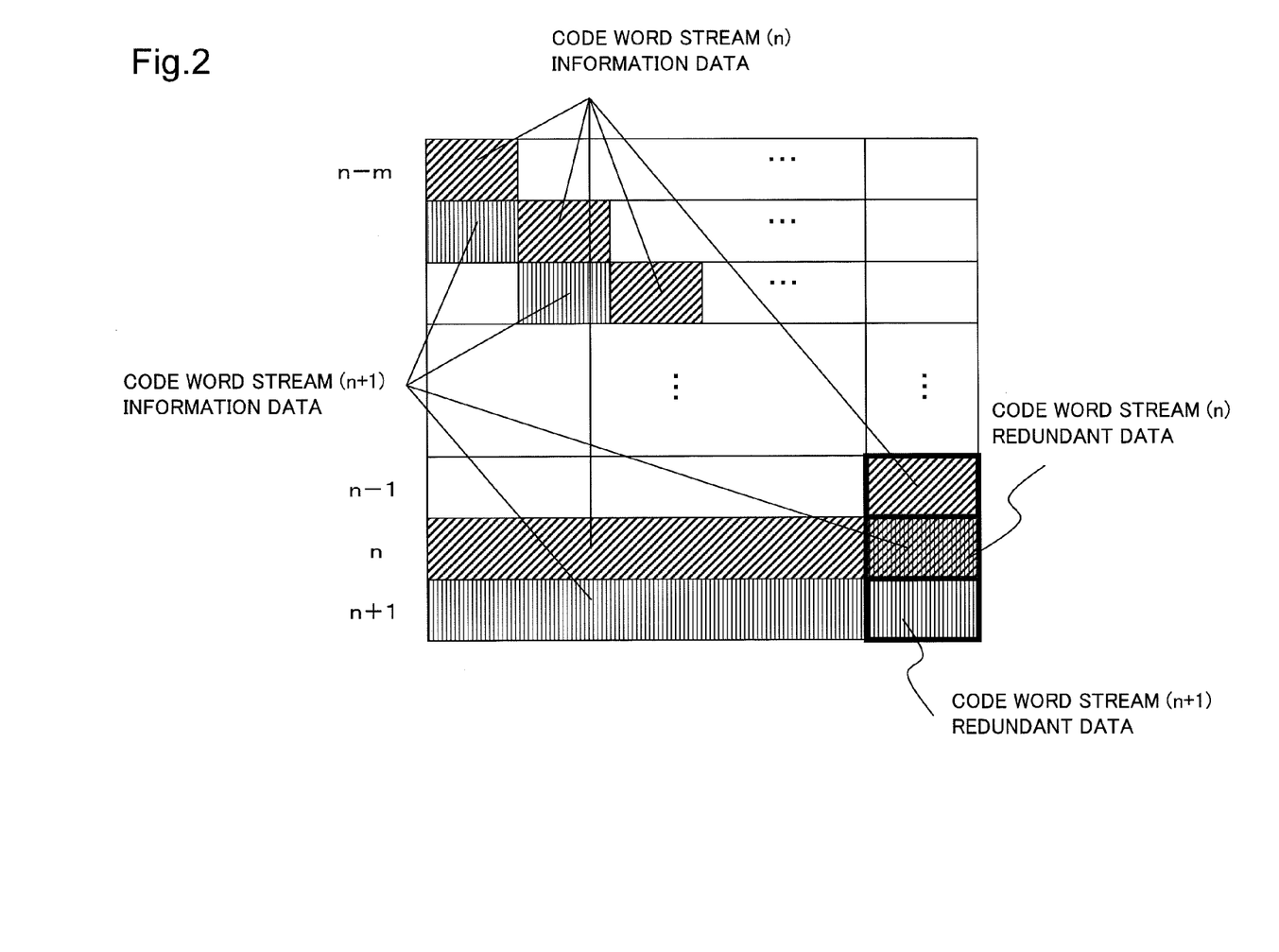
FIG. 2 shows an example of a data structure of a transmission signal or a received signal which is transmitted through a communication line and is processed with an error correcting method according to the first exemplary embodiment of the present invention.
Figure 3:
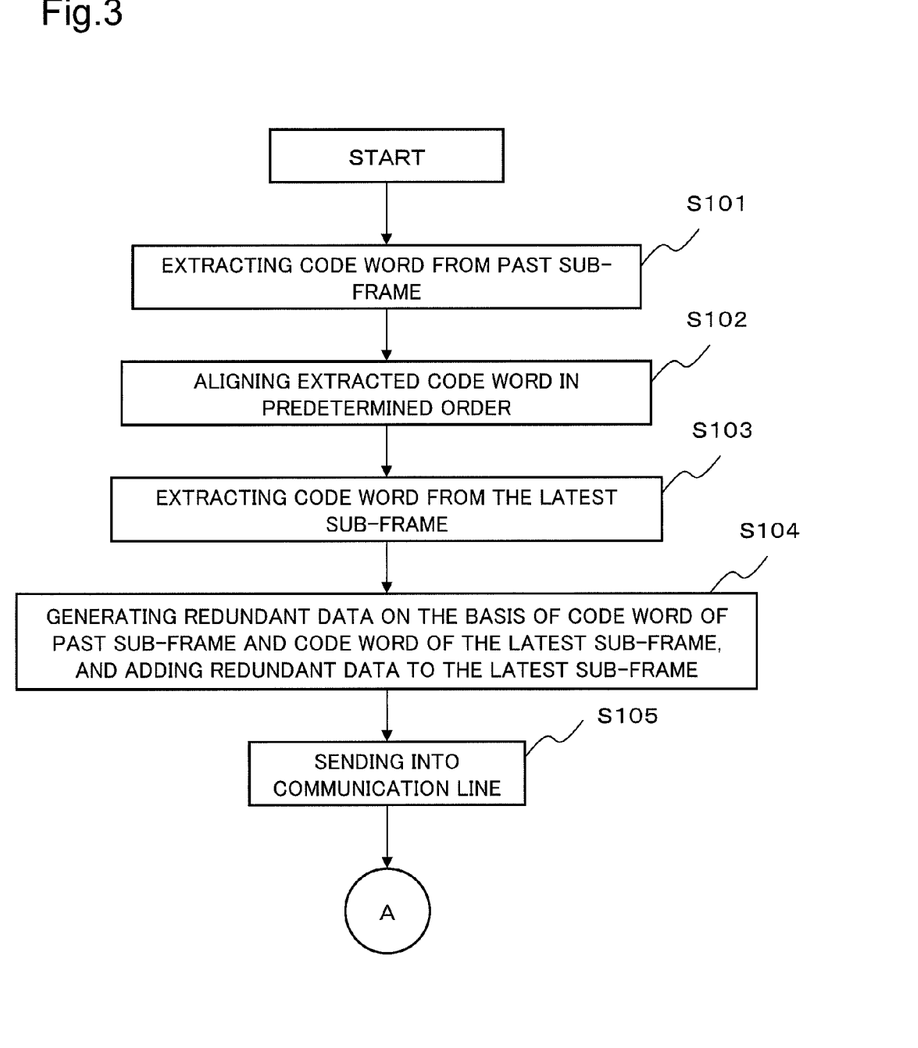
FIG. 3 is a flow chart showing an example of a transmission signal generating process by use of the error correcting method according to the first exemplary embodiment of the present invention.

FIG. 2 shows an example of a position of the information data of the code word, which is used for generating the (n)-th redundant data, in each sub-frame. A method for extracting the code word from the sub-frame is not limited to the method mentioned above.

Firstly, a first data (left end in FIG. 2) of a (n−m)-th sub-frame is extracted as a part of a code word. Next, a second data (right side of the left end) of a (n−m+1)-th sub-frame is extracted as the next part of the code word, and a third data of a (n−m+2)-th sub-frame is extracted. In the same way, a (k+1)-th data of a (n−m+k)-th sub-frame is extracted.

While FIG. 2 shows that one sub-frame is composed of m data blocks, the present invention is not limited to the composition. That is, in the case that one sub-frame includes the data blocks whose number is larger than m, the (k+1)-th code word and a (m+k+1)-th code word of the (n−m+k)-th sub-frame may be extracted. Moreover, in the case that one sub-frame includes the code words whose number is larger than (2m), the (k+1)-th code word, the (m+k+1)-th code word, and a (2m+k+1)-th code word may be extracted in the same way.

Through carrying out the above-mentioned process, the redundant data is generated sequentially by use of all data included in the (n−m)-th to the (n)-th sub-frames.

Here, the position of the extracted code word in the sub-frame is not limited to the position mentioned above. For example, a (m-k)-th data block of the (n−m+k)-th sub-frame may be extracted. Moreover, the position of the data block in each sub-frame may be determined in consideration of a processing speed of the coder 7 or the decoder 8, or the position of the code word may be determined in consideration of coding efficiency of the redundant data which is generated.

Next, a procedure of the error correcting method according to the present exemplary embodiment will be described with reference to FIGS. 1 to 4.

The interleaver 5 of the sending unit 2 holds the digital data which should be sent. That is, the interleaver 5 holds the past sub-frames, whose length corresponds to predetermined number of time steps, to extract predetermined data block from the past sub-frame (Step S101 in FIG. 3). The extracted data block is aligned on the basis of a predetermined order (Step S102 in FIG. 3), and the aligned code word is sent to the coder 7. The coder 7 extracts a data block from an input signal which is sent at a latest timing, that is, from a latest sub-frame (Step S103 in FIG. 3), and generates the redundant data from information data including data block of the past sub-frame which is sent by the interleaver 5, and data extracted from the latest sub-frame (Step S104 in FIG. 3). The generated redundant data is added to the latest sub-frame. The latest sub-frame, to which the redundant data is added, is sent into the communication line 4 as the transmission signal (Step S105 in FIG. 3).

Figure 4:
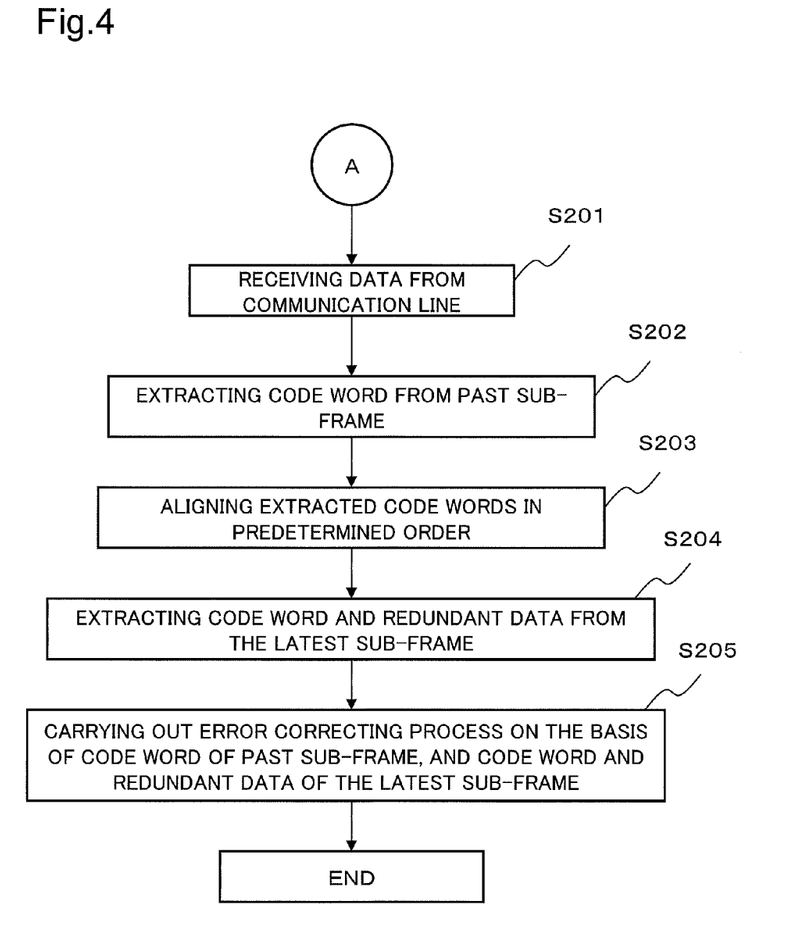
FIG. 4 is a flow chart showing an example of an error correcting process for the received signal on the basis of the error correcting process according to the first exemplary embodiment of the present invention.

The received signal, which is digital data, is transferred through the communication line 4 and is received by the receiving unit 3 (Step S201 in FIG. 4). The deinterleaver 6 holds the past sub-frames which correspond to accumulation of the received digital data and whose length corresponds to predetermined number of the time steps. The predetermined data block is extracted from the past sub-frame (Step S202 in FIG. 4). The extracted data block is aligned in a predetermined order (Step S203 in FIG. 4), and the aligned code word is sent to the decoder 8. The decoder 8 extracts information data and redundant data from the received signal which is received at the latest timing, that is, from a latest sub-frame (Step S204 in FIG. 4), and carries out the error correcting process on the basis of one code word including data block of the past sub-frame which is sent by the deinterleaver 8, and the information data and the redundant data which are extracted from the latest sub-frame (Step S205 in FIG. 4). The received signal, to which the error correcting process is carried out, is outputted as the output signal.

According to the error correcting apparatus and the error correcting method according to the first exemplary embodiment of the present invention, every data bit is included in the two error correcting code word streams. For this reason, there is a high probability that the data error is corrected with no failure. That is, error correction gain becomes high. Moreover, since one coder and one decoder are respectively installed as one component, the coder and the decoder become small in a circuit scale.

As a result, the error correcting apparatus, which can carry out the error correction accurately and which becomes miniaturized, is provided.

[Second Exemplary Embodiment]

Figure 5:
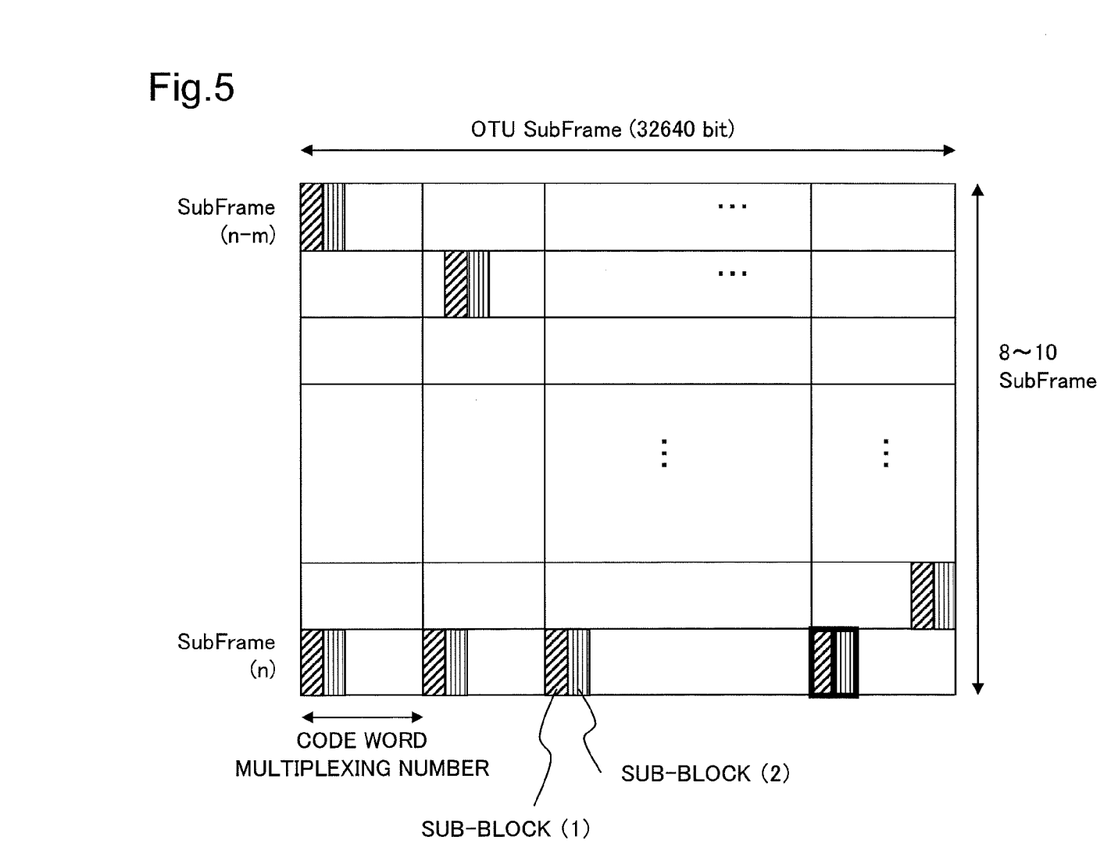
FIG. 5 shows an example of a structure of data which is processed with an error correcting method according to a second exemplary embodiment of the present invention.
Figure 6:
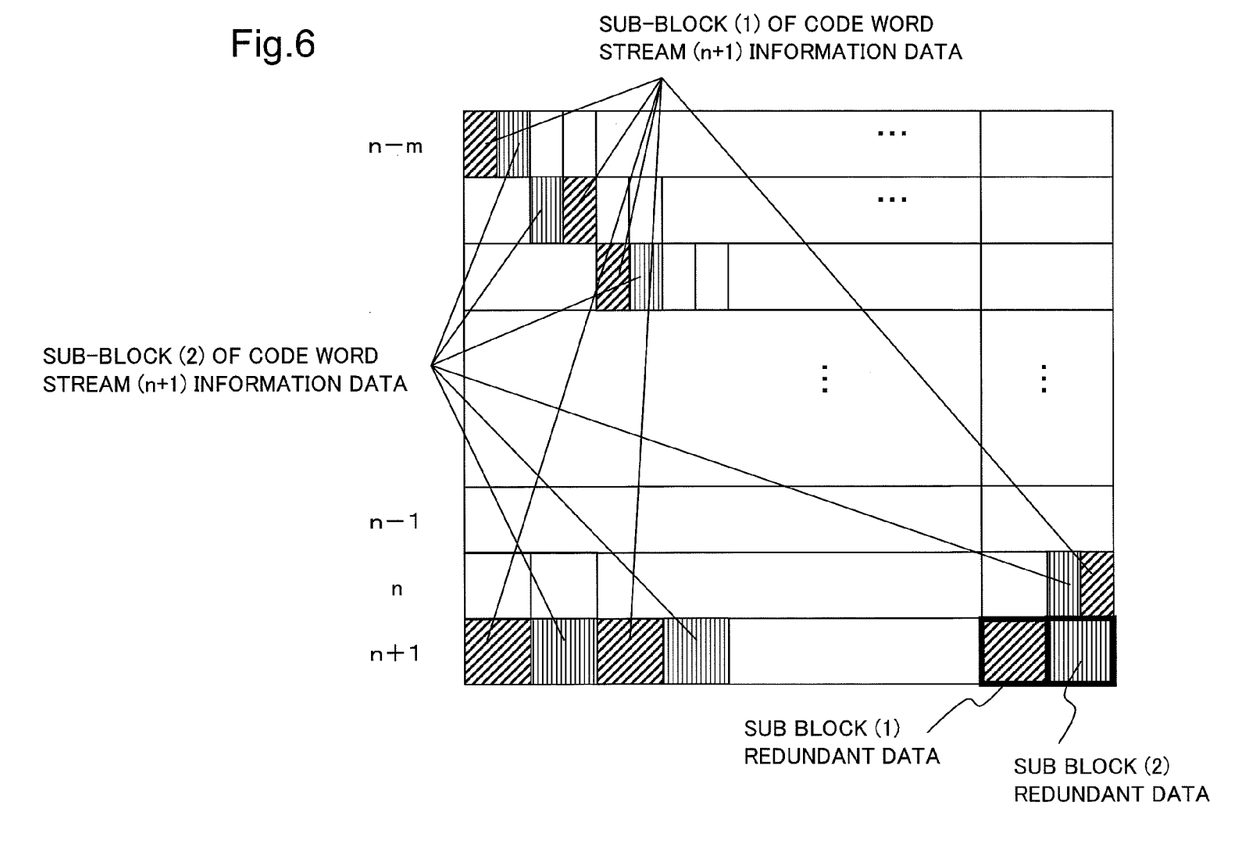
FIG. 6 shows an example of data structure of a transmission signal or a received signal which is processed with the error correcting method according to the second exemplary embodiment of the present invention.

An example of a structure of data, which is processed with an error correcting method according to a second exemplary embodiment of the present invention, is shown in FIG. 5 and FIG. 6.

According to the present exemplary embodiment, a code word, which is included in a transmission signal and a received signal, is divided into a plurality of sub-blocks, and an error correcting process is multiplexed.

Since a configuration of an error correcting apparatus 1 according to the present exemplary embodiment is almost the same as one according to the first exemplary embodiment, description on a common part is omitted.

According to the present exemplary embodiment, the error correcting method according to the first exemplary embodiment is applied to the OTU (Optical channel Transport Unit) frame which is described in ITU-T Recommendation G.709.

In the case that the present invention is applied to the OTU frame, a unit of the process is data of each row (sub-frame) of the OTU frame as shown in FIG. 5. A size of the sub-frame is, e.g., 4080 bytes, that is, 32640 bits. Each of the plural code words is multiplexed within one sub-frame. When interleaving the plurality of code words which are multiplexed, it is possible to carry out a data position change not only between the sub-frames which are different in the time domain but also between the multiplexed sub-frames.

The order of the alignment of the code word in the sub-blocks may be arbitrarily determined. For example, in the case that number of the sub-frames is 8, and number of the multiplexed code words is 64, the interleaving is carried out so that for any two bits in the same code word, another code word, to which the respective bits belong, are different from each other. Accordingly, the error correcting ability of interleave becomes higher by the interleaving. Here, in FIG. 5, there is no relation between a sub-frame index n and number of rows of the OTU frame.

When the configuration of the error correcting apparatus shown in FIG. 1 is applied to the OTU frame, the error correcting process uses the block coding scheme through multiplexing the code word. As a result, the coder and the decoder become small in a circuit scale. The coder and the decoder are based on, for example, the BCH (Bose-Chaudhuri-Hocquengham) code. At this time, it is desirable to set the largest number of the correctable bit errors to not larger than 3.

Moreover, it is desirable that a depth in the interleaving process is set to about 8 to 10 steps per the sub-frame, which corresponds to one row of the OTU frame, in consideration of a processing delay time. Furthermore, it is desirable that multiplexing number is almost equal to a length of the code word divided by two times of the depth of the interleaving.

FIG. 6 shows an example of the structure of the data which is processed with the error correcting method according to the second exemplary embodiment of the present invention. FIG. 6 shows that the plurality of code words are multiplexed. While the interleaving is carried out so that each bit of the frame may belong to two code words, another condition is not specified according to the interleaving method of the second exemplary embodiment of the present invention.

However, through carrying out the interleaving so that for any two bits in the same code word, another code word, to which the respective bits belong, are different from each other, as far as possible, the error correcting ability improves.

FIG. 6 shows an example of carrying out the interleaving not only so that data may be distributed in the time domain but also so that data may be distributed among the plural code words which are multiplexed.

According to FIG. 6, each of two code word streams (code word stream of sub block (1) and code word stream of sub block (2)) is multiplexed, and the interleaving is carried out to change position of the code word. As a result, in comparison with the case that process of only distributing the code word in the time domain within one code word stream, the distribution in the time domain is suppressed to a distribution divided by the multiplexing number, and the error correcting ability is almost unchanged.

According to the above-mentioned feature, it is possible to suppress latency in the coding process and the decoding process.

According to the error correcting apparatus and the error correcting method of the second exemplary embodiment of the present invention, through multiplexing each code word, and composing the block code word, it is possible to control an amount of data, to which the error correcting process is carried out, on the basis of processing capacity of the coder and the decoder. As a result, the coder and the decoder are miniaturized. An interleaving process speed and an error correcting process speed are determined according to a system. The multiplexing number may be controlled on the basis of a combination of these process speeds so as to optimize a process speed of a whole of the error correcting process.

Moreover, the alignment of the multiplexed code word in the interleaving process may be determined beforehand, so as to improve the accuracy of the error correcting process.

According to the error correcting method of the present invention, since the code word is generated so that every bit may be always included in two code word streams, it is possible to suppress a decline of the error correcting ability on a specific bit. Moreover, since the plurality of error correcting methods are unnecessary and the error correcting method is used commonly, it is possible to realize the error correcting method, which has superior error correcting ability, with the small-scale circuit.

The previous description of embodiments is provided to enable a person skilled in the art to make and use the present invention. Moreover, various modifications to these present exemplary embodiments will be readily apparent to those skilled in the art, and the generic principles and specific examples defined herein may be applied to other embodiments without the use of inventive faculty. Therefore, the present invention is not intended to be limited to the present exemplary embodiments described herein but is to be accorded the widest scope as defined by the limitations of the claims and equivalents.

Further, it is noted that the inventor's intent is to retain all equivalents of the claimed invention even if the claims are amended during prosecution.

Moreover, the present invention may be applied to a system including a plurality of equipments, or the present invention may be applied to a stand-alone apparatus. Furthermore, the present invention is applicable also to a case that a control program, which realizes the function of the present exemplary embodiment, is supplied to the system or the apparatus directly or remotely. Accordingly, the present invention covers a control program installed in a computer in order to realize the function of the present invention, a storage medium storing the control program, and a WWW (World Wide Web) server in which the control program is downloaded.

The invention claimed is:

1. An error correcting method for correcting an error of digital data which includes a plurality of sub-frames, the method comprising:
   extracting and aligning a first block code word included in a past sub-frame; and
   generating, by a single coder, a first redundant data block code word by use of a second block code word included in a latest sub-frame, and the aligned first block code word, and
   adding the first redundant data block code word to the latest sub-frame, wherein
   the first redundant data block code word is used for generating a second redundant data block code word which is added to a sub-frame after the latest sub-frame.

2. The error correcting method according to claim 1, wherein
   the second block code word included in the latest sub-frame is used for generating the first redundant data block code word, and also for generating a third redundant data block code word which is included in a sub-frame different from the latest sub-frame.

3. The error correcting method according to claim 1, wherein
   a first sub-block code word is included in the first block code word,
   a second sub-block code word is included in the second block code word, and
   a redundant data sub-block code word is generated by use of a first sub-block code word which is extracted from the past sub-frame and is aligned, and a second sub-block code word which is extracted from the latest sub-frame.

4. An error correcting apparatus to send digital data which includes a plurality of sub-frames into a communication line and to receive a received signal from the communication line, comprising:
   a sending unit, including:
   an interleaver, which extracts and aligns a first block code word included in a past sub-frame; and
   a coder, which generates a first redundant data block code word by use of a second block code word included in a latest sub-frame and the aligned first block code word and generates a transmission signal through adding the first redundant data block code word to the latest sub-frame; and
   a receiving unit, including:
   a deinterleaver, which extracts and aligns a third block code word included in a past sub-frame included in the received signal; and
   a decoder, which carries out an error correcting process through extracting a fourth block code word and a second redundant data block code word included in a latest sub-frame included in the received signal, wherein
   the first redundant data block code word is used for generating a third redundant data block code word which is added to a sub-frame after the latest subframe.

5. The error correcting apparatus according to claim 4, wherein
   the second block code word included in the latest sub-frame included in the transmission signal is used for generating the first redundant data block code word and also for generating a fourth redundant data block code word which is included in a sub-frame different from the latest sub-frame.

6. The error correcting apparatus according to claim 4, wherein
   a first sub-block code word is included in the first block code word,
   a second sub-block code word is included in the second block code word, and
   a redundant data sub-block code word is generated by use of a first sub-block code word which is extracted from the past sub-frame and is aligned, and a second sub-block code word which is extracted from the latest sub-frame.

7. A non-transitory computer readable medium storing a program, causing a computer to execute an error correcting process for correcting an error of digital data which includes a plurality of sub-frames, the error correcting process comprising:
   extracting and aligning a first block code word included in a past sub-frame; and
   generating, by a single coder, a first redundant data block code word by use of a second block code word included in a latest sub-frame, and the aligned first block code word, and
   adding the first redundant data block code word to the latest sub-frame, wherein
   the first redundant data block code word is used for generating a second redundant data block code word which is added to a sub-frame after the latest sub-frame.

8. The medium according to claim 7, wherein
   the second block code word included in the latest sub-frame included in the transmission signal is used for generating the first redundant data block code word, and also for generating a third redundant data block code word which is included in a sub-frame different from the latest sub-frame.

9. A sending device to send digital data which includes a plurality of sub-frames via a communication line, comprising:
   an interleaver which extracts and aligns a first block code word included in a past sub-frame; and
   a coder configured to:
   generate a first redundant data block code word by use of a second block code word included in a latest sub-frame, and the aligned first block code word, and to
   add the first redundant data block code word to the latest sub-frame, wherein
   the first redundant data block code word is used for generating a second redundant data block code word which is added to a sub-frame after the latest sub-frame.

10. A receiving device to receive digital data, which includes a plurality of sub-frames, and to correct an error of the received digital data, comprising:
   a deinterleaver which extracts and aligns a first block code word included in a past sub-frame included in the digital data; and
   a decoder configured to:
   carry out an error correcting process through extracting a second block code word and a first redundant data block code word included in a latest sub-frame included in the received signal, wherein
   the first redundant data block code word is used in an error correcting process for correcting an error of a sub-frame different from the latest sub-frame.

11. An error correcting apparatus to send digital data which includes a plurality of sub-frames via a communication line, and to receive a received signal from the communication line, comprising:
    a sending means, including:
    an interleaving means for extracting and aligning a first block code word included in a past sub-frame; and
    a coding means for generating a first redundant data block code word by use of a second block code word included in a latest sub-frame and the aligned first block code word, and for generating a transmission signal through adding the first redundant data block code word to the latest sub-frame; and
    a receiving means, including:
    a deinterleaving means for extracting and aligning a third block code word included in a past sub-frame included in the received signal; and
    a decoding means for carrying out an error correcting process through extracting a fourth block code word and a second redundant data block code word included in a latest sub-frame included in the received signal, wherein
    the first redundant data block code word is used for generating a third redundant data block code word which is added to a sub-frame after the last sub-frame.

* * * * *

UNITED STATES PATENT AND TRADEMARK OFFICE
CERTIFICATE OF CORRECTION

| | | |
|---|---|---|
| PATENT NO. | : 8,887,031 B2 | Page 1 of 1 |
| APPLICATION NO. | : 13/624542 | |
| DATED | : November 11, 2014 | |
| INVENTOR(S) | : Satomi Horita | |

It is certified that error appears in the above-identified patent and that said Letters Patent is hereby corrected as shown below:

In the Specification

Column 7, Line 53: Delete "Hocquengham)" and insert -- Hocquenghem) --

In the Claims

Column 9, Line 62: In Claim 4, delete "subframe." and insert -- sub-frame. --

Column 11, Line 24: In Claim 11, delete "last" and insert -- latest --

Signed and Sealed this
Eighteenth Day of August, 2015

Michelle K. Lee
*Director of the United States Patent and Trademark Office*